United States Patent [19]

Suzuki et al.

[11] Patent Number: 4,623,425
[45] Date of Patent: Nov. 18, 1986

[54] METHOD OF FABRICATING SINGLE-CRYSTAL SUBSTRATES OF SILICON CARBIDE

[75] Inventors: Akira Suzuki, Nara; Katsuki Furukawa; Yoshiyuki Higashigaki, both of Tenri; Shigeo Harada, Isehara, all of Japan

[73] Assignee: Sharp Kabushiki Kaisha, Osaka, Japan

[21] Appl. No.: 603,454

[22] Filed: Apr. 24, 1984

[30] Foreign Application Priority Data

Apr. 28, 1983 [JP] Japan .................................. 58-76842

[51] Int. Cl.[4] ............................................. C30B 25/02
[52] U.S. Cl. ............................. 156/613; 156/DIG. 64
[58] Field of Search ........ 156/603, 609, 610, 612–614, 156/DIG. 64; 427/93

[56] References Cited

U.S. PATENT DOCUMENTS 3,847,686 11/1974 Stein .............................. 156/612 X

FOREIGN PATENT DOCUMENTS 51-48947 12/1976 Japan .................................. 156/613
55-144499 11/1980 Japan .......................... 156/DIG. 64
408509 9/1974 U.S.S.R. ...................... 156/DIG. 67

OTHER PUBLICATIONS

"Chapter 8-The Growth of SiC by Recrystallization and Sublimation", pp. 244–266, Growth Phenomena in Silicon Carbide, vol. 18, No. 3 (1963).
"Growth of Silicon Carbide from Solution", pp. S73–S84, Mat. Res. Bull., vol. 4 (1969).
"Chapter 2-Preparative Procedures", pp. 171–179, Growth Phenomena in Silicon Carbide, vol. 18, No. 3 (1969).
"Some Properties of Vapor Deposited SiC", pp. 1158–1161, J. Electrochem. Soc., vol. 114, No. 11 (1967).
"β-Silicon Carbide Films", pp. 1440–1443, J. Electrochem. Soc., vol. 116, No. 11 (1969).
"Growth, Texture, and Surface Morphology of SiC Layers", pp. 1001–1006, J. Electrochem. Soc., vol. 118, No. 6 (1971).
"Vapor-Phase Deposition of Beta-Silicon Carbide on Silicon Substrates", pp. 138–140, J. Electrochem. Soc., vol. 120, No. 1 (1973).

Primary Examiner—David L. Lacey
Assistant Examiner—Michael S. Gzybowski
Attorney, Agent, or Firm—Stiefel, Gross, Kurland & Pavane

[57] ABSTRACT

A method of fabricating SiC single-crystal substrate having a large area and a high quality which is suited to mass production, said method comprises covering the surface of a silicon substrate with a uniform thin film of silicon carbide grown by the CVD method at a low temperature, and thereafter growing a single-crystal film of silicon carbide on the thin film by the CVD method at a higher temperature than in the preceeding step.

13 Claims, 1 Drawing Figure

METHOD OF FABRICATING SINGLE-CRYSTAL SUBSTRATES OF SILICON CARBIDE

BACKGROUND OF THE INVENTION

1. Field of the Invention

The present invention relates to a method of fabricating single-crystal substrates of silicon carbide (SiC).

2. Description of the Prior Art

SiC has many crystal structures (called "polytype") and therefore has forbidden band gaps of 2.2 to 3.3 electronvolts (eV) depending on the crystal structure. SiC is very stable thermally, chemically and mechanically and has resistance to damage due to radiation. The material can be of the p-type and n-type both with good stability, which is a rare case with wide-gap semiconductors. Accordingly SiC appears useful as a semiconductor material for electronic devices operable at high temperatures or with great electric power, for highly reliable semiconducor devices, radiation-resistant devices, etc. Further SiC will provide electronic devices which are usable in an environment where difficulties are encountered with devices made of conventional semiconductor materials, thus greatly enlarging the range of applications for semiconductor devices. Making use of its wide energy gap, SiC is also usable as a semiconductor material for optoelectronic devices for the visible light of short wavelengths and near-ultraviolet light. Whereas other wide-gap semiconductors usually have a heavy metal contained as the main component and therefore entail the problems of pollution and resources, SiC is free of these problems and therefore appears to be a promising electronic material.

Despite these many advantages and capabilities, SiC has not been placed into actual use because the technique still remains to be established for growing SiC crystals with good reproducibility which is required for commercially fabricating SiC substrates of large area with high quality and high productivity.

Conventional processes for preparing SiC single-crystal substrates on a laboratory scale include the so-called sublimation method [also termed the "Lely method"; "Growth Phenomena in Silicon Carbide" W. F. Knippenberg: Philips Research Reports, Vol. 18, No. 3, pp. 161-274 (1963). (Chapter 8 "The Growth of SiC by Recrystallization and Sublimation", pp. 244-266)] wherein SiC powder is sublimed in a graphite crucible at 2,200° C. to 2,600° C. and recrystallized to obtain an SiC substrate, the so-called solution method ["Growth of Silicon Carbide from Solution" R. C. Marshall: Material Research Bulletin, Vol. 4, pp. S73-S84 (1969)] wherein silicon or a mixture of silicon with iron, cobalt, platinum or like impurities is melted in a graphite crucible to obtain an SiC substrate, and the Acheson method ["Growth Phenomena in Silicon Carbide" W. F. Knippenberg: Philips Research Reports, Vol. 18, No. 3, pp. 161-274 (1963). (Chapter 2 "Preparative Procedures", pp. 171-179)] which is generally used for commercially producing abrasives and by which SiC substrates are obtained incidentally.

With the sublimation method and the solution method, a large number of crystals can be obtained, but it is difficult to prepare large SiC single-crystal substrates since many crystal nuclei occur in the initial stage of crystal growth, while the SiC product has several kinds of crystal structures (polytype). Thus, these processes have yet to be improved for preparing large SiC single crystals of single polytype with good reproducibility. Thus SiC substrate incidentally obtained by the Acheson method must be improved in purity and crystallinity for use as a semiconductor material, so that the process is not suited to commercial production of SiC substrates.

With improvements in semiconductor techniques in recent years, it has become possible to form a thin single-crystal film of 3C-type SiC (having a crystal structure of cubic system and an energy gap of 2.2 eV) on a foreign substrate of silicon (Si) which is available as a large-sized single-crystal substrate of good quality, by the heteroepitaxial technique with chemical vapor deposition (CVD) ["Some properties of Vapor Deposited SiC" K. E. Bean and P. S. Gleim: Journal of the Electrochemical Society, Vol. 114, No. 11, pp. 1158-1161 (1967). "β-Silicon Carbide Films P. Rai-Choudhury and N. P. Formigoni: Journal of the Electrochemical Society, Vol. 116, No. 10, pp. 1440-1443 (1969). "Growth, Texture, and Surface Morphology of SiC Layers" K. A. Jacobson: Journal of the Electrochemical Society, Vol. 118, No. 6, pp. 1001-1006 (1971). "Vapor-Phase Deposition of Beta-Silicon Carbide on Silicon Substrates" K. Kuroiwa and T. Sugano: Journal of the Electrochemical Society, Vol. 120, No. 1, pp. 138-140 (1973)]. The CVD method is a fabrication technique having high productivity on a commercial scale and is a promising technicque for growing an SiC single-crystal film of large area and high quality over Si substrates with good reproducibility. Usually used in this method are $SiH_4$, $SiCl_4$, $SiH_2Cl_2$, $(CH_3)_3SiCl$ or $(CH_3)_2SiCl_2$ as the silicon source, $CCl_4$, $CH_4$, $C_3H_8$ or $C_2H_6$ as the carbon source, and hydrogen, argon or the like as the carrier gas for epitaxially forming a thin single-crystal film of 3C-type SiC on an Si substrate which is heated to a temperature of 1,200° C. to 1,400° C.

However, SiC is not satisfactorily compatible (wettable) with the Si foreign substrate, while SiC differs from Si by as much as 20% in lattice constant, so that even if it is attempted to grow a single crystal of SiC directly on the Si substrate, SiC fails to grow into a layer of a single-crystal film but grows into a polycrystalline form of dendritic structure, or a very thin single-crystal film, if obtained, tends to become deteriorated and polycrystalline with an increase in its thickness.

SUMMARY OF THE INVENTION

The present invention provides a method of fabricating a single-crystal substrate of SiC having a large area and a high quality by covering the surface of an Si substrate first with a very thin SiC layer grown by the CVD method at a low temperature instead of growing a single crystal of SiC directly on the Si substrate crystal, and thereafter growing a single crystal of SiC on the layer by the CVD method under single crystal growth conditions.

BRIEF DESCRIPTION OF THE DRAWINGS

The accompanying drawing is a view showing a growth apparatus for use in describing examples of the invention.

DESCRIPTION OF THE PREFERRED EMBODIMENT

Figure 1:
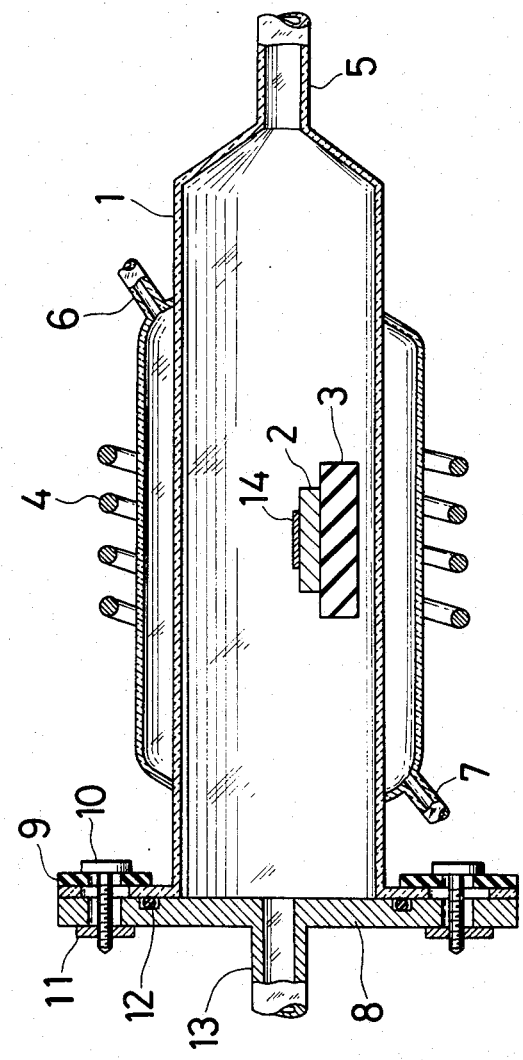

Thus, the present invention provides a method of fabricating a single-crystal substrate of silicon carbide characterized by covering the surface of a silicon substrate with a uniform thin film of silicon carbide grown by the CVD method at a low temperature, and thereafter growing a single-crystal film of silicon carbide on the thin film by the CVD method at a higher temperature than in the preceeding step.

According to the present invention, the surface of an Si substrate is first uniformly covered with a very thin SiC film by growing the film by the CVD method at a low temperature. By holding the Si substrate at a lower temperature in this step than in the step of growing a single crystal, the growing atmosphere can be supersaturated with the starting source gases to a greater extent, permitting formation of SiC growth nuclei on the substrate with an increased density to cover the substrate surface with a uniform SiC film. When the temperature of the substrate is low, a polycrystalline or amorphous SiC film of poor crystallinity is generally deposited on the substrate. This film holds the Si substrate out of direct contact with the SiC single-crystal film to be subsequently formed, acting to prevent deterioration of the SiC single-crystal film that could result from the difference in lattice constant between Si and SiC single crystal. Satisfactory results can be achieved insofar as the thin film formed by the CVD method at a low temperature uniformly covers the substrate surface. Thus, the thin film is as small as about 10 to about 1,000 Å, preferably about 100 to about 500 Å, in thickness.

The term "low temperature" herein used means a temperature which is lower than the temperature for growing a single crystal of SiC and at which a thin SiC film can be formed. More specifically, the low temperature is in the range of 800° C. to 1,200° C., preferably 1,000° C. to 1,100° C., at atmospheric pressure. On the other hand, the temperature for growing the single crystal of SiC is 1,200° C. to 1,400° C., preferably 1,300° C. to 1,350° C., at atmospheric pressure.

The CVD method is conducted by supplying a mixture of silicon gas and carbon gas to the surface of an Si substrate. As already mentioned with reference to the prior art, the gas mixture is composed of a silicon source (such as $SiH_4$, $SiCl_4$, $SiH_2Cl_2$, $(CH_3)_3SiCl$ or $(CH_3)_2SiCl_2$) and a carbon source (such as $CCl_4$, $CH_4$, $C_3H_8$ or $C_2H_6$).

Further, a carrier gas such as hydrogen or argon may be used.

For the low-temperature CVD method, the gas mixture is fed generally at a rate of 0.01 to 10 c.c./min, preferably 0.05 to 5 c.c./min. The mixing ratio of the silicon source to the carbon source is generally 0.01 to 10, preferably 0.5 to 5, in terms of Si/C atom number ratio. The time taken for the formation of the thin film is 0.5 to 10 minutes, preferably 1 to 5 minutes. The thickness of the thin film can be controlled primarily by adjusting the supply of the gas mixture and the film forming time. Briefly it is desired to control these factors so as to give the aforementioned film thickness.

Subsequently a single-crystal film of SiC is formed on the thin SiC film by the CVD method at an elevated growth temperature of 1,200° C. to 1,400° C. at atmospheric pressure. In this case, the supply of the gas mixure may be interrupted after forming the thin SiC film to raise the growth temperature and thereafter resume the process for forming the SiC single-crystal film. Alternatively the growth temperature may be raised while supplying the gas mixture to grow the SiC single-crystal film.

The SiC single-crystal film is suitably 1 to 50 μm, practically 0.5 to 5 μm or 10 to 50 μm, in thickness. A film of such a thickness can be obtained generally by supplying the gas mixture at a rate of 0.01 to 10 c.c./min, preferably 0.05 to 5 c.c./min, in a mixing ratio (Si/C atom number ratio) of 0.01 to 10, preferably 0.5 to 5, for 0.5 to 15 hours (growing time).

The foregoing conditions for the CVD method to be practiced at the low temperature, as well as at the higher temperature, involve atmospheric pressure, while the method of the invention can be practiced at a reduced pressure for example, of 0.01 to 100 torr, preferably 0.1 to 10 torr. The low temperature, as well as the higher temperature, can then be slightly lower (for example, by 100° C.), and a more uniform SiC film will be formed over the entire surface of the silicon substrate. The foregoing conditions will be suitably varied when the kinds of source gases and the size of the apparatus are changed.

The method of the present invention forms on an Si substrate a single-crystal film of SiC having a thickness of at least 1 μm, a higher quality and a large area and is therefore suited to mass production, thus assuring remarkably improved productivity. This realizes semiconductor devices with use of silicon carbide on a commercial scale.

The method of the invention is useful not only for the combination of an Si substrate and a single-crystal film of SiC but also for wide application involving heteroepitaxial growth of single-crystals on substrates of different kinds. The present method is therefore of high technical significance.

The present invention will be described in greater detail with reference to the following examples.

FIG. 1 is a diagram showing the apparatus used in the examples. The apparatus comprises a water-cooled horizontal quartz double reactor tube 1 which is internally provided with a quartz table 3 having a graphite sample support 2 placed thereon. The reactor tube 1 is wound with a working coil 4, through which a radio-frequency (rf) current is passed to heat the sample support 2 by induction. The sample support 2 may be positioned horizontally or as suitably inclined. The reactor tube 1 has at its one end a branch tube 5 providing a gas inlet. Through branch tubes 6, 7, cooling water is supplied to the interior of the outer tube of the reactor tube 1. The other end of the reactor tube 1 is sealed by a stainless steel flange 8, holding plate 9, bolts 10, nuts 11 and an O-ring 12. The flange 8 has a branch tube 13 providing a gas outlet. Crystals were grown in the following manner with use of the apparatus.

EXAMPLE 1

(1) A single-crystal substrate of Si (measuring 15 mm×15 mm) 14 was placed on the sample support 2. With the air within the reactor tube 1 replaced by hydrogen gas, rf current was passed through the working coil 4 to heat the graphite sample support 2 and raise the temperature of the Si substrate 14 to about 1,050° C. As source gases, monosilane ($SiH_4$) was fed to the reactor tube at a rate of 0.2 c.c./min and propane ($C_3H_8$) at 0.4 c.c./min. Hydrogen was fed to the tube at a rate of 3 liters/min as a carrier gas. These gases were fed through the branch tube 5 for 1 minute, whereby a very thin polycrystalline film of 3C-type SiC having a thickness of about 250 Å was formed to uniformly cover the surface of the Si substrate 14.

(2) With the supply of the material gases interrupted while passing the hydrogen carrier gas through the reactor tube 1, an increased amount of rf current was then passed through the working coil 4 to heat the sample support 2 and set the Si substrate 14 to a temperature of about 1,350° C. With the supply of hydrogen carrier gas maintained at the rate of 3 liters/min, SiH$_4$ was fed at a rate of 0.04 c.c./min and C$_3$H$_8$ at 0.02 c.c./min to form a single-crystal film of 3C-type SiC on the Si substrate 14 covered with the very thin SiC film. Over the entire surface of the substrate, the single-crystal film grew to a thickness of 0.7 μm in 30 minutes after the start of the second step and to a thickness of 2.5 μm in 2 hours.

EXAMPLE 2

(1) An Si single-crystal substrate (measuring 15 mm×15 mm) 14 was placed on the sample support 2. With the air within the reactor tube 1 replaced by hydrogen gas, rf current was passed through the working coil 4 to heat the graphite sample support 2 and raise the temperature of the Si substrate 14 to about 1,050° C. As source gases, dichlorosilane (SiH$_2$Cl$_2$) was fed to the reactor tube at a rate of 0.58 c.c./min and propane (C$_3$H$_8$) at 0.77 c.c./min. Hydrogen was fed to the tube 1 at a rate of 3 liters/min as a carrier gas. These gases were fed through the branch tube 5 for 1 minute, whereby a very thin polycrystalline film of 3C-type SiC having a thickness of about 100 Å was formed to uniformly cover the surface of the Si substrate 14.

(2) Subsequently, with the supply of hydrogen gas maintained at the rate of 3 liters/min, SiH$_2$Cl$_2$ and C$_3$H$_8$ were fed to the reactor tube 1 at reduced rates of 0.15 c.c./min and 0.075 c.c./min, respectively, and an increased amount of rf current was passed through the working coil 4 to heat the sample support 2 and set the Si substrate 14 to a temperature of about 1,350° C.

(3) With the supply of hydrogen gas further maintained at the rate of 3 liters/min, SiH$_2$Cl$_2$ and C$_3$H$_8$ were then fed to the reactor at increased rates of 0.20 c.c./min and 0.15 c.c./min, respectively, to form a single-crystal film of 3C-type SiC on the thin SiC film over the Si substrate. Over the entire surface area of the substrate, the single-crystal film grew to a thickness of 1.4 μm in 2 hours and to a thickness of 4.5 μm in 6 hours.

While the low-temperature SiC growth step and the higher-temperature SiC single crystal growth step were both performed by the CVD method at atmospheric pressure in the above examples, the CVD method may be practiced at a reduced pressure for one or both of these steps. The carrier gas, which was hydrogen, may be an inert gas such as argon, helium or the like. The SiH$_4$ or SiH$_2$Cl$_2$ which was used as the silicon source gas and the C$_3$H$_8$ used as the carbon source gas can be replaced by other silicon and carbon gases.

What we claim is:

1. A method of fabricating a single-crystal substrate of silicon carbide comprising the steps of:
   (a) first depositing a uniform thin film of polycrystalline or amorphous silicon carbide, grown using the CVD method at a low temperature, on a surface of a silicon substrate, said low temperature being below the temperature at which silicon carbide single-crystal growth occurs, and
   (b) thereafter growing on top of the thin film deposited in the first step a single-crystal film of silicon carbide using the CVD method at a higher temperature than that used in the first step, said higher temperature being a temperature at which silicon carbide single-crystal growth occurs.

2. The method of claim 1, wherein the low temperature is in the range between 800° C. and 1,200° C., the higher temperature is in the range between 1,200° C. and 1,400° C., and the steps are performed at atmospheric pressure.

3. The method of claim 1, wherein the low temperature is in the range of 1,000° C. to 1,100° C., and the higher temperature is in the range of 1,300° C. to 1,350° C., and the steps are performed at atmospheric pressure.

4. The method of claim 1 wherein the thin film of polycrystalline or amorphous silicon carbide grown by the CVD method at the low temperature is 10 to 1,000 Å thick.

5. The method of claim 1 wherein the thin film of polycrystalline or amorphous silicon carbide is 100 to 500 Å thick.

6. The method of claim 1 wherein the single-crystal film of silicon carbide grown on the thin film of polycrystalline or amorphous silicon carbide is 0.5 to 50 μm thick.

7. The method of claim 1 wherein the single-crystal film is 0.5 to 5 μm thick.

8. The method of claim 1, wherein the single-crystal film is 10 to 50 μm thick.

9. The method of claim 1, wherein step
   (a) is conducted by contacting a mixture of silicon source gas and carbon source gas with the surface of the silicon substrate and step
   (b) is conducted by contacting a mixture of silicon source gas and carbon source gas with the thin film of polycrystalline or amorphous silicon carbide produced in step (a).

10. The method of claim 9, wherein the silicon source gas is selected from the group consisting of SiH$_4$, SiCl$_4$, SiH$_2$CL$_2$, (CH$_3$)$_3$SiCl and (CH$_3$)$_2$SiCl$_2$, and the carbon source gas is selected from the group consisting of CCl$_4$, CH$_4$, C$_3$H$_8$ and C$_2$H$_6$.

11. The method of claim 9, wherein the mixtures of silicon source gas and carbon source gas further comprise a carrier gas.

12. The method of claim 9 wherein a mixing ratio of the mixture of the silicon source gas and the carbon source gas is 0.01 to 10 expressed as Si/C atom number ratio.

13. The method of claim 12 wherein the mixing ratio is 0.5–5.

* * * * *